(12) United States Patent
Chung et al.

(10) Patent No.: US 7,879,700 B2
(45) Date of Patent: Feb. 1, 2011

(54) CRYSTALLIZATION APPARATUS AND METHOD OF AMORPHOUS SILICON

(75) Inventors: Ui-Jin Chung, Suwon-si (KR);
Dong-Byum Kim, Seoul (KR);
Su-Gyeong Lee, Seoul (KR);
Myung-Koo Kang, Seoul (KR);
Hyun-Jae Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 1215 days.

(21) Appl. No.: 10/547,070

(22) PCT Filed: Feb. 24, 2004

(86) PCT No.: PCT/KR2004/000382

§ 371 (c)(1),
(2), (4) Date: Aug. 25, 2005

(87) PCT Pub. No.: WO2004/077544

PCT Pub. Date: Sep. 10, 2004

(65) Prior Publication Data

US 2006/0148165 A1    Jul. 6, 2006

(30) Foreign Application Priority Data

Feb. 25, 2003    (KR)    ...................... 10-2003-0011643

(51) Int. Cl.
*H01L 21/322* (2006.01)
*H01L 21/428* (2006.01)
(52) U.S. Cl. .................................. 438/487; 219/121.65
(58) Field of Classification Search ............ 219/121.65, 219/121.66, 121.76, 121.77, 121.85; 438/487, 438/486; 257/E21.134
See application file for complete search history.

(56) References Cited

U.S. PATENT DOCUMENTS

| | | | | |
|---|---|---|---|---|
| 3,722,996 A | * | 3/1973 | Fox | .............................. 355/53 |
| 4,502,762 A | * | 3/1985 | Anderson | .................... 359/488 |
| RE33,836 E | * | 3/1992 | Resor et al. | .................... 355/43 |
| 6,177,301 B1 | * | 1/2001 | Jung | .......................... 438/150 |
| 6,326,286 B1 | * | 12/2001 | Park et al. | .................... 438/478 |

(Continued)

FOREIGN PATENT DOCUMENTS

DE    3016000 A    * 11/1981

(Continued)

OTHER PUBLICATIONS

Patent Abstracts of Japan, Publication No. 08-203843, Aug. 9, 1996, 1.

(Continued)

*Primary Examiner*—Samuel M Heinrich
(74) *Attorney, Agent, or Firm*—Innovation Counsel LLP

(57) ABSTRACT

A silicon crystallization system includes a beam generator generating a laser beam, first and second optical units for controlling the laser beam from the beam generator; and a stage for mounting a panel including an amorphous silicon layer to be polycrystallized by the laser beam from the optical units. The first optical unit makes the laser beam have a transverse edge and a longitudinal edge longer than the transverse edge, and the second optical unit makes the laser beam have a transverse edge and a longitudinal edge shorter than the transverse edge.

17 Claims, 5 Drawing Sheets

U.S. PATENT DOCUMENTS

| | | | |
|---|---|---|---|
| 6,335,509 B1 * | 1/2002 | Jung | 219/121.77 |
| 6,429,100 B2 * | 8/2002 | Yoneda | 438/487 |
| 6,495,405 B2 * | 12/2002 | Voutsas et al. | 438/166 |
| 6,518,180 B1 * | 2/2003 | Fukuda | 438/671 |
| 6,521,866 B1 * | 2/2003 | Arai et al. | 219/121.73 |
| 6,535,535 B1 * | 3/2003 | Yamazaki et al. | 372/43.01 |
| 6,707,614 B2 * | 3/2004 | Tanaka | 359/626 |
| 6,809,013 B2 * | 10/2004 | Ito | 438/487 |
| 6,811,954 B1 * | 11/2004 | Fukuda | 430/311 |
| 6,849,824 B2 * | 2/2005 | Arai et al. | 219/121.7 |
| 7,011,911 B2 * | 3/2006 | Kim et al. | 430/5 |
| 7,071,082 B2 * | 7/2006 | Jung | 438/486 |
| 7,115,503 B2 * | 10/2006 | Im | 438/660 |
| 7,651,567 B2 * | 1/2010 | Jung | 117/201 |
| 2002/0197759 A1 | 12/2002 | Yang | |
| 2003/0024905 A1 | 2/2003 | Tanaka | |
| 2003/0068836 A1 * | 4/2003 | Hongo et al. | 438/30 |
| 2003/0088848 A1 * | 5/2003 | Crowder | 716/19 |
| 2004/0043606 A1 * | 3/2004 | Crowder et al. | 438/662 |
| 2004/0201874 A1 | 10/2004 | Yamazaki | |
| 2004/0219768 A1 * | 11/2004 | Kang et al. | 438/486 |
| 2004/0240492 A1 | 12/2004 | Kojima et al. | |
| 2005/0055016 A1 | 3/2005 | Tanaka et al. | |
| 2005/0213218 A1 | 9/2005 | Tanaka et al. | |
| 2007/0042575 A1 * | 2/2007 | Lee et al. | 438/488 |

FOREIGN PATENT DOCUMENTS

| | | | |
|---|---|---|---|
| JP | 361222040 A * | 10/1986 | |
| JP | 05-226275 | 9/1993 | |
| JP | 8-203843 | 8/1996 | |
| JP | 9-293687 | 11/1997 | |
| JP | 11-340159 | 12/1999 | |
| JP | 02000190087 A * | 7/2000 | |
| JP | 2000275668 A | 10/2000 | |
| JP | 2001156015 A * | 6/2001 | |
| JP | 2002043245 A | 2/2002 | |
| JP | 2003045803 A | 2/2003 | |
| JP | 2003051445 A | 2/2003 | |
| JP | 2003-151916 | 5/2003 | |
| JP | 2003151907 A | 5/2003 | |
| JP | 2003229269 A | 8/2003 | |
| JP | 2003282441 A | 10/2003 | |
| JP | 2003-332235 | 11/2003 | |
| JP | 2004111972 A | 4/2004 | |
| JP | 2005-109460 | 4/2005 | |
| KR | 99-66433 A | 8/1999 | |
| KR | 10-2002-0066408 A | 8/2002 | |
| KR | 02-86047 A | 11/2002 | |
| KR | 10-2003-0007610 A | 1/2003 | |
| KR | 03-90211 A | 11/2003 | |
| KR | 04-24711 A | 3/2004 | |
| KR | 10-2005-0003235 | 1/2005 | |
| KR | 10-2005-0054444 | 6/2005 | |
| KR | 10-2005-0057923 | 6/2005 | |
| KR | 10-2006-0131518 | 12/2006 | |
| TW | 490729 | 6/2002 | |
| TW | 490743 | 6/2002 | |
| TW | 517260 | 1/2003 | |
| TW | 517289 | 1/2003 | |
| WO | WO 02/86954 A1 | 10/2002 | |

OTHER PUBLICATIONS

Patent Abstracts of Japan, Publication No. 09-293687, Nov. 11, 1997, 1 p.

Patent Abstracts of Japan, Publication No. 11-340159, Dec. 10, 1999, 1 p.

Patent Abstracts of Japan, Publication No. 2003-151916, May 23, 2003, 1 p.

Patent Abstracts of Japan, Publication No. 2003-332235, Nov. 21, 2003, 1 p.

Korean Patent Abstracts, Publication No. 2005-109460, Apr. 21, 2005, 1 p.

Korean Patent Abstracts, Publication No. 1020050003235, Jan. 10, 2005, 1 p.

Korean Patent Abstracts, Publication No. 1020050054444, Jun. 10, 2005, 1 p.

Korean Patent Abstracts, Publication No. 1020050057923, Jun. 16, 2005, 1 p.

Korean Patent Abstracts, Publication No. 1020060131518, Dec. 20, 2006, 2 pp.

Korean Patent Publication Abstract, Publication No. 1999-0066433, Aug. 16, 1999, 1 p.

Korean Patent Abstracts, Publication No. 1020010086047 A, Nov. 18, 2002, 1 p.

Korean Patent Abstracts, Publication No. 1020030090211 A, Nov. 28, 2003, 1 p.

Korean Patent Abstracts, Publication No. 1020040024711 A, Mar. 22, 2004, 1 p.

* cited by examiner

CRYSTALLIZATION APPARATUS AND METHOD OF AMORPHOUS SILICON

The present invention relates to a system and a method of polyscrystallization, and in particular, to a system and a method of forming a polysilicon layer of a thin film transistor array panel.

Generally, silicon is classified into amorphous silicon and crystalline silicon based on its crystalline state. Since the amorphous silicon can be deposited at a low temperature to form a thin film, it is usually used for thin film transistors (TFTs) formed on a glass substrate, which has a low melting point, of a liquid crystal panel.

However, the amorphous silicon thin film has disadvantages such as low field effect mobility and thus polycrystalline silicon having high field effect mobility of about 30 $cm^2/V \cdot sec$, high frequency operation characteristics, and low leakage current is required.

The electrical characteristics of the polysilicon thin film are significantly affected by the size of grains. For example, the larger grains give higher field effect mobility.

A sequential lateral solidification (SLS) that grows grains in lateral directions using a laser beam is suggested to obtain large grains.

This technique uses the fact that the grain growth in a liquid phase region adjacent to a solid phase region starts at the interface between the liquid phase region and the solid phase region and proceeds along a direction perpendicular to the interface. In the SLS technique, a laser beam passes through a mask having a plurality of slit type transmissive areas arranged offset from each other and melts amorphous silicon to form liquid phase regions having a shape of the slits. Then, the liquid phase amorphous silicon becomes cooled to be crystallized. As described above, the grain growth starts from the interfaces between the liquid phase regions and solid phase regions, which are not exposed to the laser beam, and proceeds in a direction perpendicular to the interfaces, and the grains stop growing when they meet at the center of the liquid phase region. The SLS can crystallize the whole thin film by moving the mask in the direction normal to the growing direction of the grains.

In the meantime, the laser beam has the shape and the energy determined by an optical unit which can make only a single shape and a single energy of the laser beam. Accordingly, it is difficult to obtain shapes and energies suitable for various areas.

A silicon crystallization system is provided, which includes: a beam generator generating a laser beam; a plurality of first and second optical units for controlling the laser beam from the beam generator; and a stage for mounting a panel including an amorphous silicon layer to be polycrystallized by the laser beam from the optical units, wherein the first and the second optical units make the laser beam have different shapes.

The first optical unit may make the laser beam have a transverse edge and a longitudinal edge longer than the transverse edge, and the second optical unit may make the laser beam have a transverse edge and a longitudinal edge shorter than the transverse edge. The laser beam from the first and the second optical units may have a rectangular shape.

The panel may include a display panel including a display area, a gate driving circuit area, and a data driving circuit area.

Preferably, the display area and the gate driving circuit area are illuminated by the laser beam controlled by the first optical unit and the data driving circuit area is illuminated by the laser beam controlled by the second optical unit. More preferably, the display area and the gate driving circuit area are illuminated through a two shot mask and the data driving circuit area is illuminated through a multi-shot mask.

The two shot mask may have a plurality of slits for defining areas transmitting the laser beam and forming two columns and the slits in the two columns may be offset preferably by a distance equal to width of the slits.

The multi-shot mask may have a plurality of slits for defining areas transmitting the laser beam and forming three or more columns and the slits in the columns may be offset preferably by a distance equal to or smaller than half of width of the slits.

The silicon crystallization system may further include a position controller for positioning the first and the second optical units.

A silicon crystallization system is provided, which includes: a beam generator generating a laser beam; a beam splitter for splitting the laser beam into a plurality of beamlets; a plurality of first and second optical units for controlling the beamlets from the beam splitter; and a stage for mounting a panel including an amorphous silicon layer to be polycrystallized by the beamlets from the optical units, wherein the first and the second optical units make the laser beam have different shapes.

The first optical unit may make the beamlet have a transverse edge and a longitudinal edge longer than the transverse edge, and the second optical unit may make the beamlet have a transverse edge and a longitudinal edge shorter than the transverse edge. The beamlets from the first and the second optical units may have a rectangular shape.

The panel may include a display panel including a display area, a gate driving circuit area, and a data driving circuit area.

Preferably, the display area and the gate driving circuit area are illuminated by the beamlets controlled by the first optical unit and the data driving circuit area is illuminated by the beamlet controlled by the second optical unit. More preferably, the display area and the gate driving circuit area are illuminated through a two shot mask and the data driving circuit area is illuminated through a multi-shot mask.

The two shot mask may have a plurality of slits for defining areas transmitting the beamlets and forming two columns and the slits in the two columns are offset preferably by a distance equal to width of the slits.

The multi-shot mask may have a plurality of slits for defining areas transmitting the beamlet and forming three or more columns and the slits in adjacent columns are offset preferably by a distance equal to or smaller than half of width of the slits.

A method of silicon crystallization is provided, which includes: depositing an amorphous silicon layer on a substrate having a display area, a gate driving circuit area, and a data driving circuit area; illuminating a first laser beam onto the display area and the gate driving area of the amorphous silicon layer through a first mask having a plurality of slits for transmitting the first laser beam; illuminating a second laser beam onto the data driving area of the amorphous silicon layer through a second mask having a plurality of slits for transmitting the second laser beam; and crystallizing the amorphous silicon layer, wherein the shapes of the first and the second laser beams are different.

The first laser beam may have a transverse edge and a longitudinal edge longer than the transverse edge and the second laser beam may have a transverse edge and a longitudinal edge shorter than the transverse edge.

The slits of the first and the second masks form a plurality of columns and the slits in the columns are offset. Preferably, the slits of the first mask form two columns and the slits of the second mask form at least three columns.

The first and the second laser beams are selectively generated from a single initial laser beam or simultaneously generated by splitting a single initial laser beam.

The present invention will become more apparent by describing embodiments thereof in detail with reference to the accompanying drawings in which.

Figure 3:
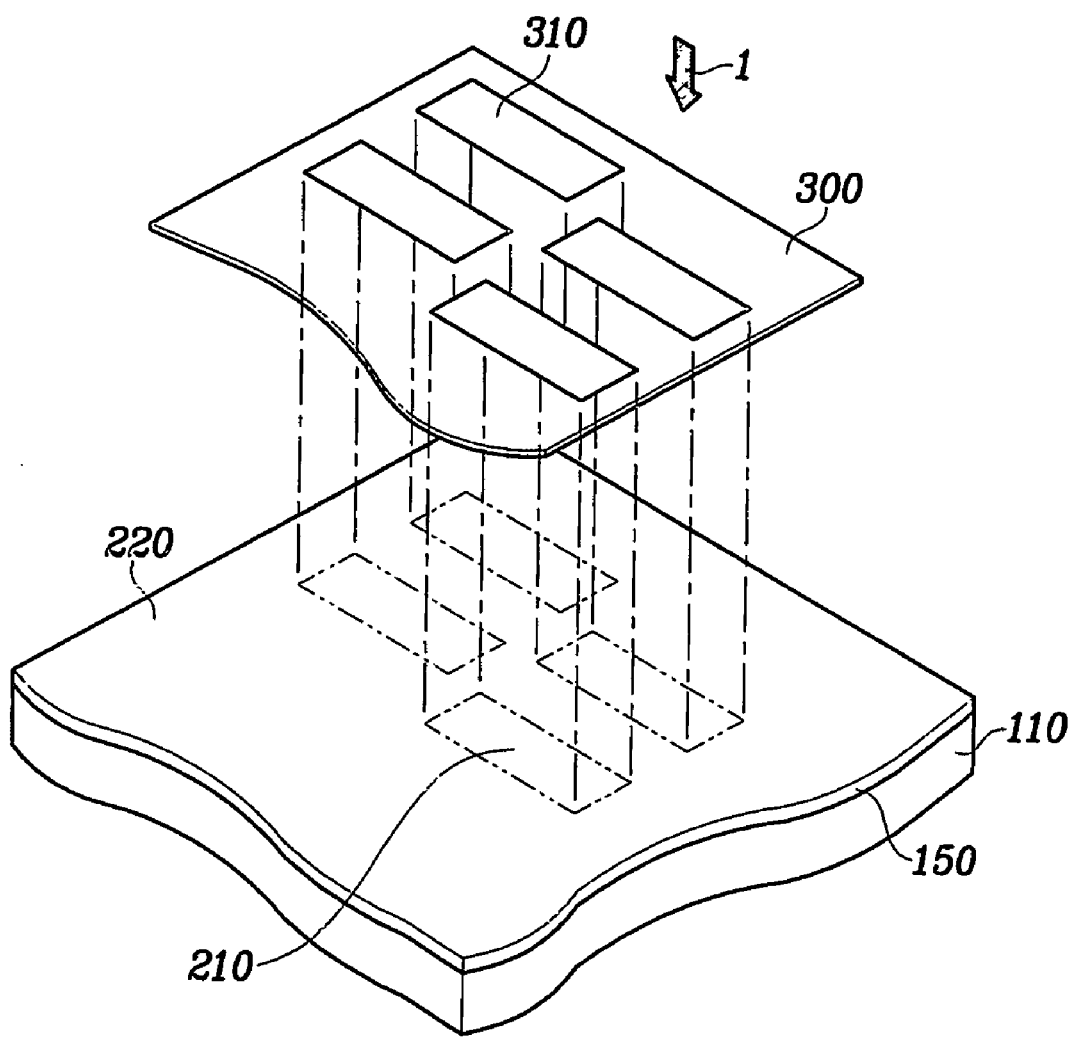
Figure 4:
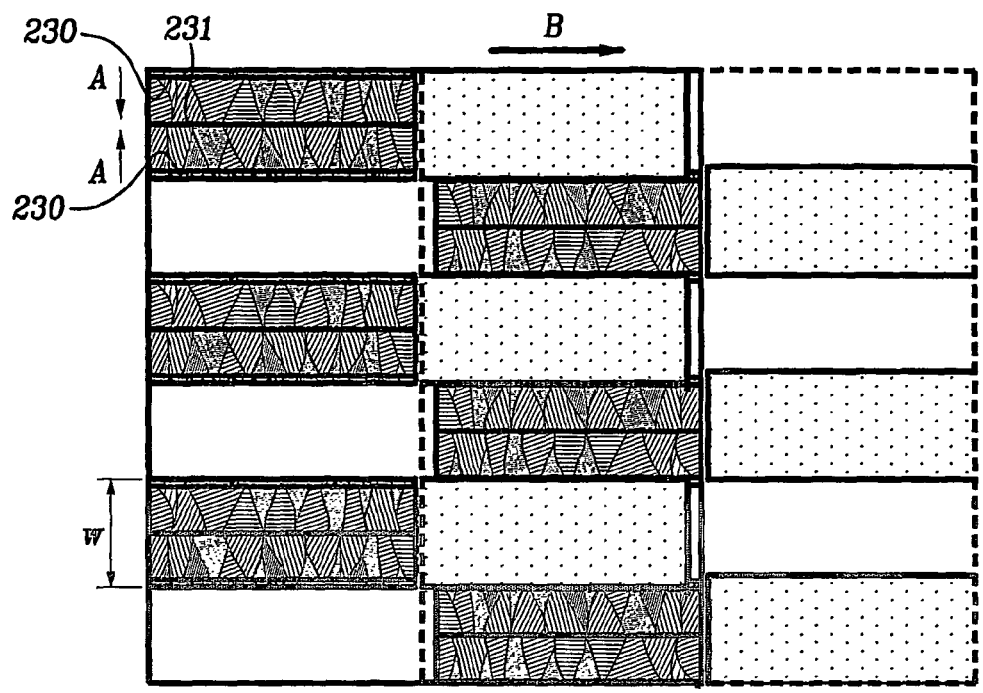
Figure 5:
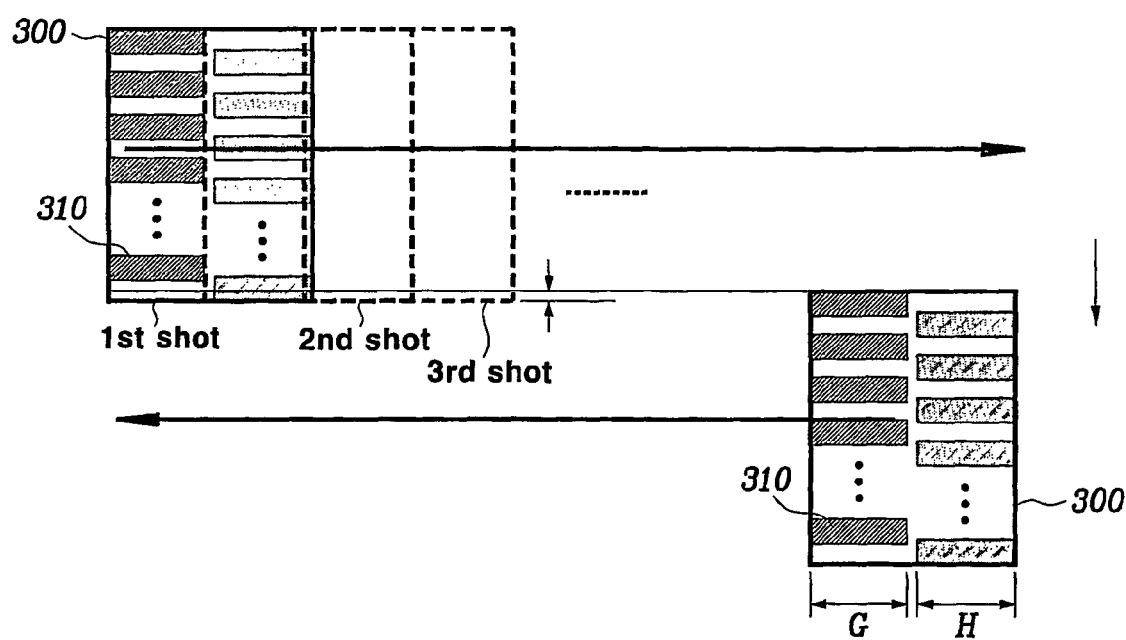
Figure 6:
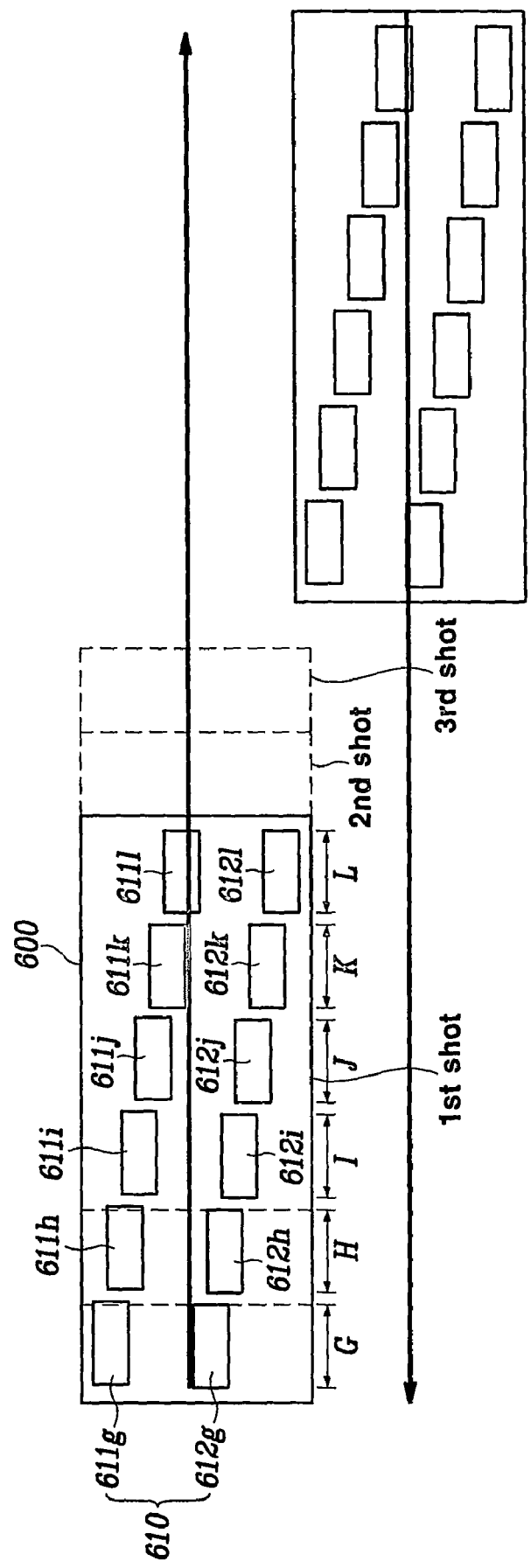
Figure 7:
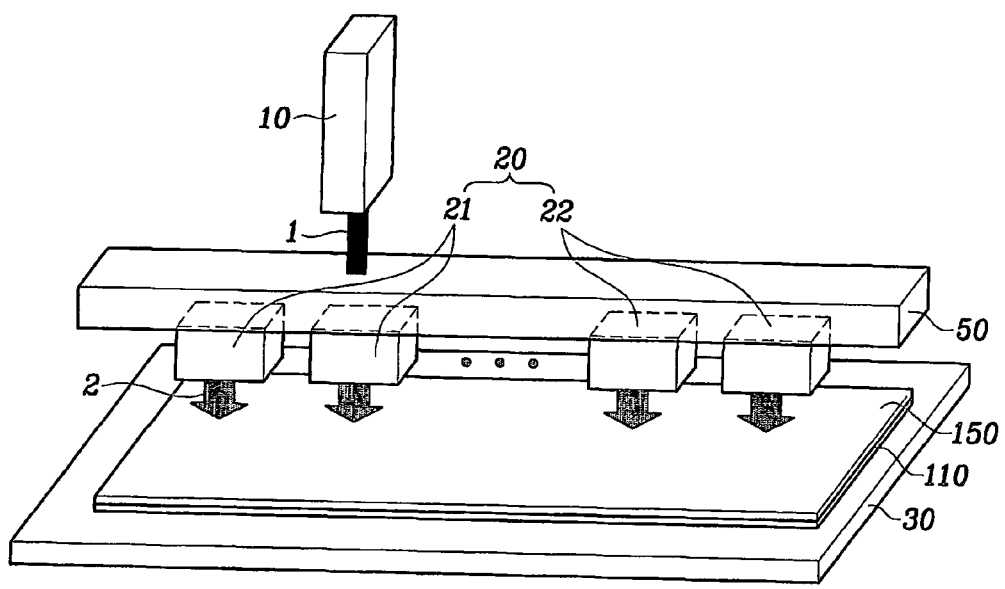
Figure 8:
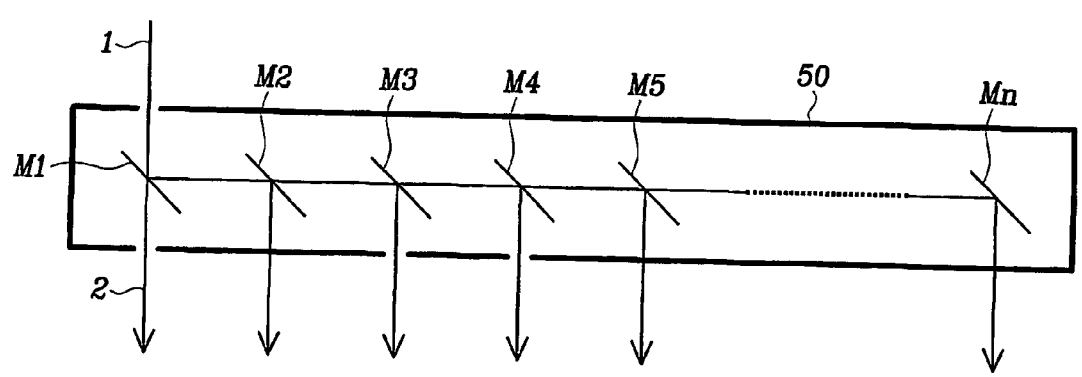

FIG. 3 schematically illustrates a two shot SLS process crystallizing amorphous silicon into polysilicon by illuminating a laser beam;

FIG. 4 illustrates grains of polysilicon formed by a two shot SLS process;

FIG. 5 illustrates movement of a two shot mask in a two shot SLS process;

FIG. 6 illustrates movement of a six-shot mask in a multi-shot SLS process;

FIG. 7 is a schematic diagram of a silicon crystallization system according to another embodiment of the present invention; and FIG. 8 is a schematic diagram of a beam splitter of the silicon crystallization system shown in FIG. 7 according to an embodiment of the present invention.

The present invention now will be described more fully hereinafter with reference to the accompanying drawings, in which preferred embodiments of the invention are shown.

The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being 'on' another element, it can be directly on the other element or intervening elements may also be present. In contrast, when an element is referred to as being 'directly on' another element, there are no intervening elements present.

Then, systems and methods of silicon crystallization according to embodiments of the present invention are described with reference to accompanying drawings.

A silicon crystallization system according to an embodiment of the present invention is described in detail with reference to FIGS. 1 to 6.

Figure 1:
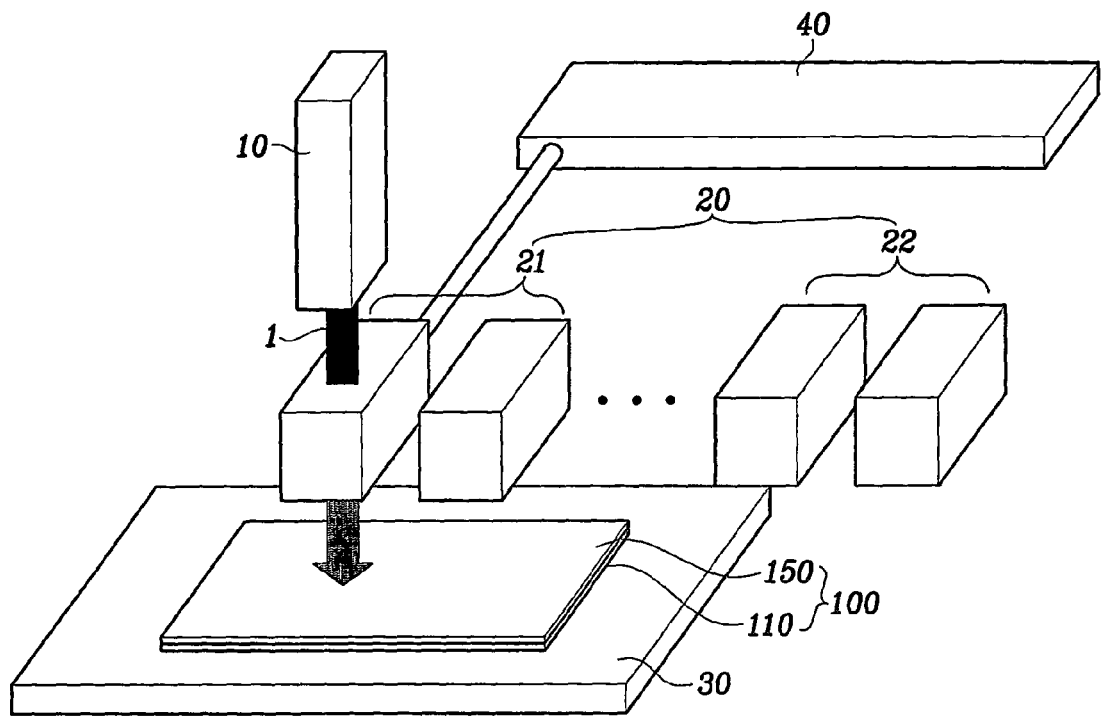
FIG. 1 is a schematic diagram of a silicon crystallization system according to an embodiment of the present invention.
Figure 2:
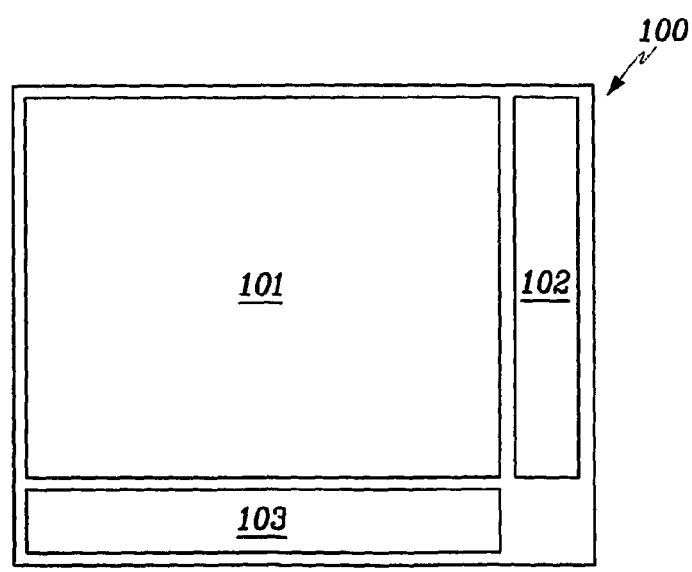
FIG. 2 is a plan view of a liquid crystal panel according to an embodiment of the present invention.

FIG. 1 is a schematic diagram of a silicon crystallization system according to an embodiment of the present invention, and FIG. 2 is a plan view of a liquid crystal panel according to an embodiment of the present invention.

Referring to FIG. 1, a silicon crystallization system according to this embodiment includes a laser beam generator 10 generating a laser beam 1, a plurality of optical units 20 controlling the shape and the energy of the laser beam 1 from the beam generator 10, and a position controller 40 for controlling the position of the optical units 20. The silicon crystallization system further includes a stage 30 mounting a liquid crystal panel 100 and illuminated by the laser beam 1 from the optical units 20.

The optical units 20 include a first optical unit 21 for shaping the laser beam 1 to have a rectangular cross section having short transverse edges and long longitudinal edges and a second optical unit 22 for shaping the laser beam 1 to have a rectangular cross section having long transverse edges and short longitudinal edges. The first and the second optical units 21 and 22 include a plurality of optical sub-units for various shapes and sizes of the laser beam 1.

On of the optical sub-units are selected and disposed between the beam generator 10 and the stage 30 by the position controller 40.

The liquid crystal panel 100 includes an insulating substrate 110 and an amorphous silicon layer 150 deposited on the insulating substrate 110 to be polycrystallized by the laser beam from the beam generator 10. The liquid crystal panel 100 includes a display area 101 and a peripheral area including a gate driving circuit area 102 and a data driving circuit area 103. The data driving area 103 is to be provided with analog-to-digital (D/A) converters (not shown) and digital-to-analog (D/A) converters (not shown) requiring high performance TFTs.

According to an embodiment of the present invention, the display area 101 and the gate driving circuit area 102 are crystallized by a two shot SLS process ensuring large productivity, while the data driving circuit area 103 is crystallized by a three-or-more-shot (referred to as 'multi-shot' hereinafter) SLS process ensuring high performance TFTs as well as large productivity.

First, a two shot SLS process according to an embodiment of the present invention is described with reference to FIGS. 3-5 as well as FIGS. 1 and 2.

FIG. 3 schematically illustrates a two shot SLS process crystallizing amorphous silicon into polysilicon by illuminating a laser beam, FIG. 4 illustrates grains of polysilicon formed by a two shot SLS process, and FIG. 5 illustrates movement of a two shot mask in a two shot SLS process.

Referring to FIGS. 2 and 3, a two shot SLS process illuminates the laser beam 1 onto an exposure area of the amorphous silicon layer 150 on the display area 101 or the gate driving circuit area 103 through a two shot mask 300 including a plurality of transmissive areas 310 having a slit shape.

As shown in FIG. 5, the two shot mask 300 is elongated in a longitudinal direction and thus the laser beam 1 preferably has the same shape as the mask 300. Accordingly, one of the optical sub-units of the first optical unit 21 is disposed between the beam generator 10 and the stage 30 as shown in FIG. 1.

The slits 310 of the two shot mask 300 are elongated in a transverse direction and has a width W, and they form two columns G and H arranged in the transverse direction. The slits 310 in each column are spaced apart from each other by a predetermined distance preferably equal to the width W of the slits 310, and the slits 310 in the two columns are offset by a distance preferably equal to the width W of the slits 310. The two shot mask 300 covers the exposure area of the amorphous silicon layer 150.

Portions of the amorphous silicon layer 150 facing the transmissive areas 310 and illuminated by the laser beam are completely melted to form liquid phase regions 210, while portions indicated by reference numeral 220 remains in solid phase. The width and the length of the liquid phase regions 210 are equal to those of the slits 310. The grain growth starts at interfaces 230 between the liquid phase regions 210 and the solid phase regions 210 along a direction A normal to the interfaces 230. The growing grains meet at mid-planes 231 of the liquid phase regions 210 and the grain growth stops there.

Once an exposure step (also called a shot) is finished, the two shot mask 300 is moved by a distance equal to the length of the slits 310, i.e., equal to half of the width of the two shot mask 300 in the length direction of the slits 310. Then, the exposure area in the previous step partly overlaps the exposure area of this exposure step. That is, a right half of the previous exposure area becomes a left half of the this exposure area to experience light exposure again, and the solid phase areas 220 in the right half of the previous exposure area are illuminated by the laser beam to become liquid phase regions. Consequently, all regions of the overlapping area of the amorphous silicon layer in the two consecutive exposure steps are polycrystallized and the grains formed in the two exposure steps have a width equal to the width W of the slits 310.

The exposure steps are repeated from left to right and the laser beam is scanned from left to right. After the scanning reaches the right edge of the amorphous silicon layer 150, the two shot mask 300 is moved downward by a distance of its length and the scanning is stepped downward. Thereafter, the movement of the mask 300 and the scanning proceed from right to left.

In this way, all areas of the amorphous silicon layer 150 are polycrystallized.

A multi-shot SLS process is described in detail with reference to FIG. 6 as well as FIGS. 1 and 2.

The multi-shot SLS process fully polycrystallizes a predetermined area of an amorphous silicon layer 150 by multiple shots, preferably three to six shots. Seven or more shots may be performed for obtaining high performance TFTs. The term 'multi-shot' indicates three or more shots in the specification.

FIG. 6 illustrates movement of a six-shot mask in a multi-shot SLS process.

Referring to FIG. 6, a six shot mask 600 has a plurality of slit type transmissive areas 610 elongated in a transverse direction and forming six columns G, H, I, J, K and L. Each column G, H, I, J, K or L includes a pair of slits 611g and 612g, 611h and 612h, 611i and 612i, 611j and 612j, 611k and 612k, or 611l and 612l spaced apart from each other by a predetermined distance preferably twice the width of the slits 610. The slits 610 in adjacent two columns G, H, I, J, K and L are offset by a predetermined distance preferably equal to or smaller than half of the width of the slits 610, are arranged like lowering steps from left to right. The slit 611l in the last column L and the slit 612g in the first column G are also offset by a predetermined distance preferably equal to or larger than half of the width of the slits 610. The number of the slits 610 in each column G, H, I, J, K or L may be one, three or more.

The six shot mask 600 is elongated in the transverse direction and thus the laser beam 1 preferably has the same shape as the mask 600. Accordingly, one of the optical sub-units of the second optical unit 22 is disposed between the beam generator 10 and the stage 30.

The mask 600 covering an exposure area of the amorphous silicon layer 150 on the data driving circuit area 102 is aligned with the amorphous silicon layer 150 and a laser beam 1 is illuminated through the mask 600 for polycrystallization. Then, one thirds of the exposure area is crystallized when the distance between the slits 610 in each column G, H, I, J, K or L is twice the width of the slits 610. After the polycrystallization, the mask 600 is moved by a distance equal to the length of the slits 610, i.e., equal to one sixths of the width of the mask 600 in the length direction of the slits 610. Then, right five sixths of the exposure area in the previous shot overlaps the exposure area of this exposure step. When the slits 610 in adjacent columns are offset by half of the width of the slits 610, one fourths of portions, which are not exposed to light in the previous shot, and half of portions, which are exposed to light in the previous shot, is illuminated by the laser beam 1 to be polycrystallized. In detail, a region of the amorphous silicon layer 150 facing the slit 611k includes an upper half, which is not exposed to the laser beam 1 in the previous shot, and a lower half which is illuminated by the laser beam 1 through the slit 611l in the previous shot. The grain growth in the lower half of the regions in this shot starts from a boundary of a grain located thereunder and formed in the previous shot and proceeds in the upward direction, which is the same growing direction of the grain. As a result, the grain formed in the previous shot extends to the upward direction by a width equal to half of the width of the slits 610.

The grain growth continues during the six exposure steps and the grains have a width three times the width of the slits 610. The large grains of the polysilicon enable to obtain TFTs having high charge carrier mobility.

Similarly, an n shot SLS process forms grains having a width equal to n/2.

A silicon crystallization system according to another embodiment of the present invention is described in detail with reference to FIGS. 7 and 8.

FIG. 7 is a schematic diagram of a silicon crystallization system according to another embodiment of the present invention, and FIG. 8 is a schematic diagram of a beam splitter of the silicon crystallization system shown in FIG. 7 according to an embodiment of the present invention.

Referring to FIG. 7, a silicon crystallization system according to this embodiment includes a laser beam generator 10 generating a laser beam 1, a beam splitter 50 for splitting the laser beam 1 from the beam generator 10 into a plurality of beamlets 2 having equal energy, a plurality of optical units 20 controlling the shape and the energy of the beamlets 2 from the beam splitter 50, and a stage 30 mounting a liquid crystal panel 100 and illuminated by the beamlets 2 from the optical units 20.

As shown in FIG. 8, the beam splitter 50 includes a plurality of, i.e., first to n-th mirrors M1-Mn provided therein. Each mirror M1-Mn makes an angle of about 45 degrees with a proceeding direction of the laser beam 1. The first mirror M1 partly transmits the laser beam 1 to generate a beamlet 2 having energy equal to 1/n of the energy of the laser beam 1 incident on the beam splitter 50 and partly reflects the incident beam to generate a laser beam having remaining portions (1−1/n) of the energy of the incident beam 1. Each of the second to the (n−1)-th mirror M2-Mn−1 partly reflects an incident laser beam reflected from a previous mirror M1-Mn−2 to generate a beamlet 2 having energy equal to 1/n of the energy of the laser beam 1 and partly transmits the incident beam to generate an output beam having remaining portions of the energy of the incident beam. Then, the output beam from the i-th mirror (1<i<n) has energy equal to (1−i/n) of the energy of the initial laser beam 1. The last, n-th mirror Mn fully reflects an incident beam having energy equal 1/n of the energy of the laser beam 1 to generate a beamlet 2.

The optical units 20 include a first optical unit 21 for shaping the beamlets 2 to have a rectangular cross section having short transverse edges and long longitudinal edges and a second optical unit 22 for shaping the beamlets 2 to have a rectangular cross section having long transverse edges and short longitudinal edges. The first and the second optical units 21 and 22 include a plurality of optical sub-units for various shapes and sizes of the beamlets 2.

The beamlets 2 from the first and the second optical units 21 and 22 are simultaneously illuminated on the amorphous silicon layer 150. For example, the beamlets 2 from the first optical unit 21 are illuminated on the display area 101 and the gate driving circuit area 102 through a two shot mask, while the beamlet(s) 2 from the second first optical unit 21 is illuminated on the data driving circuit area 103 through a multi-shot mask.

The silicon crystallization system and method selectively or simultaneously illuminate laser beams having various shapes and energies using a plurality of optical units, thereby improving productivity and characteristics of a device.

While the present invention has been described in detail with reference to the preferred embodiments, those skilled in the art will appreciate that various modifications and substitutions can be made thereto without departing from the spirit and scope of the present invention as set forth in the appended claims.

The invention claimed is:

1. A silicon crystallization system comprising:
a beam generator generating a laser beam;
first and second optical units for controlling the laser beam from the beam generator; and
a stage for mounting a panel including an amorphous silicon layer to be polycrystallized by the laser beam from the first and second optical units, wherein the first optical unit makes a first laser beam having a transverse edge and a longitudinal edge longer than the transverse edge,
wherein the second optical unit makes a second laser beam having a transverse edge and a longitudinal edge shorter than the transverse edge,
wherein the panel comprises a display panel including a display area and a gate driving circuit area illuminated by the first laser beam through a two shot mask, and a data driving circuit area illuminated by the second laser beam through a multi-shot mask,
wherein the two shot mask has a plurality of slits for defining areas transmitting the first laser beam and forming two columns, and
wherein the multi-shot mask has a plurality of slits for defining areas transmitting the second laser beam and forming three or more columns.

2. The silicon crystallization system of claim 1, wherein the laser beam from the first and the second optical units has a rectangular shape.

3. The silicon crystallization system of claim 1, wherein the slits of the two shot mask in the two columns are offset.

4. The silicon crystallization system of claim 3, wherein the slits in the two columns are offset by a distance equal to width of the slits.

5. The silicon crystallization system of claim 4, wherein the slits of the multi-shot mask in adjacent columns are offset.

6. The silicon crystallization system of claim 5, wherein the slits in the adjacent columns are offset by a distance equal to or smaller than half of width of the slits.

7. The silicon crystallization system of claim 1, further comprising a position controller for positioning the first and the second optical units.

8. A silicon crystallization system comprising:
a beam generator generating a laser beam;
a beam splitter for splitting the laser beam into a plurality of beamlets;
first and second optical units for controlling the beamlets from the beam splitter; and
a stage for mounting a panel including an amorphous silicon layer to be polycrystallized by the beamlets from the first and second optical units, wherein the first optical unit makes a first laser beam having a transverse edge and a longitudinal edge longer than the transverse edge,
wherein the second optical unit makes a second laser beam having a transverse edge and a longitudinal edge shorter than the transverse edge,
wherein the panel comprises a display panel including a display area and a gate driving circuit area illuminated by the first laser beamlet through a two shot mask, and a data driving circuit area illuminated by the second laser beamlet through a multi-shot mask,
wherein the two shot mask has a plurality of slits for defining areas transmitting the first laser beam and forming two columns, and
wherein the multi-shot mask has a plurality of slits for defining areas transmitting the second laser beam and forming three or more columns.

9. The silicon crystallization system of claim 8, wherein the beamlets from the first and the second optical units have a rectangular shape.

10. The silicon crystallization system of claim 8, wherein the slits of the two shot mask in the two columns are offset.

11. The silicon crystallization system of claim 10, wherein the slits in the two columns are offset by a distance equal to width of the slits.

12. The silicon crystallization system of claim 11, wherein the slits of the multi-shot mask in adjacent columns are offset.

13. The silicon crystallization system of claim 12, wherein the slits in the adjacent columns are offset by a distance equal to or smaller than half of width of the slits.

14. A method of silicon crystallization, the method comprising:
depositing an amorphous silicon layer on a substrate having a display area, a gate driving circuit area, and a data driving circuit area;
illuminating a first laser beam from a first optical unit onto the display area and the gate driving area of the amorphous silicon layer through a first mask having a plurality of slits for transmitting the first laser beam;
illuminating a second laser beam from a second optical unit onto the data driving area of the amorphous silicon layer through a second mask having a plurality of slits for transmitting the second laser beam; and
crystallizing the amorphous silicon layer, wherein the first laser beam has a transverse edge and a longitudinal edge longer than the transverse edge,
wherein the second laser beam has a transverse edge and a longitudinal edge shorter than the transverse edge, and wherein the slits of the first mask form two columns and the slits of the second mask form at least three columns.

15. The method of claim 14, wherein the slits of the first and the second masks form a plurality of columns and the slits in the columns are offset.

16. The method of claim 14, wherein the first and the second laser beams are selectively generated from a single initial laser beam.

17. The method of claim 14, wherein the first and the second laser beams are simultaneously generated by splitting a single initial laser beam.

* * * * *